US012652969B2

(12) United States Patent
Cheng et al.

(10) Patent No.: US 12,652,969 B2
(45) Date of Patent: Jun. 9, 2026

(54) CONFINED PHASE-CHANGE MEMORY CELL WITH SELF-ALIGNED ELECTRODE AND REDUCED THERMAL LOSS

(71) Applicant: International Business Machines Corporation, Armonk, NY (US)

(72) Inventors: Kangguo Cheng, Schenectady, NY (US); Juntao Li, Cohoes, NY (US); Julien Frougier, Albany, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 830 days.

(21) Appl. No.: 17/650,751

(22) Filed: Feb. 11, 2022

(65) Prior Publication Data

US 2023/0263080 A1     Aug. 17, 2023

(51) Int. Cl.
*H10N 70/00* (2023.01)
*H10N 70/20* (2023.01)

(52) U.S. Cl.
CPC ....... *H10N 70/8413* (2023.02); *H10N 70/066* (2023.02); *H10N 70/231* (2023.02); *H10N 70/882* (2023.02); *H10N 70/8825* (2023.02); *H10N 70/8828* (2023.02)

(58) Field of Classification Search
CPC ............. H10N 70/8413; H10N 70/066; H10N 70/882; H10N 70/8825; H10N 70/8828; H10N 70/884; H10N 70/826; H10N 70/021; H10N 70/061; H10N 70/231
See application file for complete search history.

(56) References Cited

U.S. PATENT DOCUMENTS

| | | | |
|---|---|---|---|
| 6,579,760 B1 | 6/2003 | Lung | |
| 7,005,665 B2 | 2/2006 | Furkay et al. | |
| 7,463,512 B2 | 12/2008 | Lung | |
| 7,728,319 B2 | 6/2010 | Goux et al. | |

(Continued)

FOREIGN PATENT DOCUMENTS

| | | |
|---|---|---|
| CN | 105428533 B | 5/2018 |
| CN | 111969105 A | 11/2020 |

(Continued)

OTHER PUBLICATIONS

Lee, et al., "Atomic layer deposition of chalcogenides for next-generation phase change memory", Journal of Materials Chemistry C, vol. 9, No. 11, Mar. 21, 2021, pp. 3707-3725.

(Continued)

*Primary Examiner* — Monica D Harrison
*Assistant Examiner* — Moataz Khalifa
(74) *Attorney, Agent, or Firm* — Seed Intellectual Property Law Group LLP

(57) ABSTRACT

A confined phase-change memory cell with self-aligned electrode includes a first conductive structure within a first dielectric layer. A phase-change memory pillar including a first portion of a phase-change material is confined within a second dielectric layer and electrically connected to the first conductive structure. A second conductive structure within a third dielectric layer is surrounded by a second portion of the phase-change material for electrically connecting the second conductive structure to the phase-change memory pillar and reducing heat loss.

19 Claims, 6 Drawing Sheets

100

(56) References Cited

U.S. PATENT DOCUMENTS

| | | |
|---|---|---|
| 7,812,334 B2 | 10/2010 | Liu |
| 7,888,155 B2 | 2/2011 | Chen |
| 9,070,872 B2 | 6/2015 | Huo et al. |
| 9,136,466 B2 | 9/2015 | Son |
| 10,381,411 B2 | 8/2019 | Lille |
| 10,797,107 B2 | 10/2020 | Wu |
| 10,991,879 B2 | 4/2021 | Ruiz et al. |
| 2009/0194758 A1 | 8/2009 | Chen |
| 2020/0119270 A1 | 4/2020 | Petz |
| 2020/0395412 A1 | 12/2020 | Lee |
| 2021/0135104 A1 | 5/2021 | Ok et al. |
| 2021/0257547 A1 | 8/2021 | Shen et al. |
| 2021/0328139 A1* | 10/2021 | Lee ................... H10N 70/8828 |

FOREIGN PATENT DOCUMENTS

| | | | |
|---|---|---|---|
| KR | 20100122228 A | * 11/2010 | ......... H10N 70/8413 |
| WO | 2023/151430 A1 | 8/2023 | |

OTHER PUBLICATIONS

Leskela, et al., "Atomic Layer Deposition of Materials for Phase-Change Memories", ECS Transactions, 25 (4), pp. 399-407.

Park, et al., "Developing Precursor Chemistry for Atomic Layer Deposition of High-Density, Conformal GeTe Films for Phase-Change Memory", Chemistry of Materials 31, 2019, pp. 8663-8672.

International Searching Authority, "Notification of International Search Report and Written Opinion or Declaration", International Application No. PCT/CN2023/070360, Mailed Mar. 29, 2023, 7 pages.

* cited by examiner

100

212

210

110    104

104

102

100

104

110

102

104

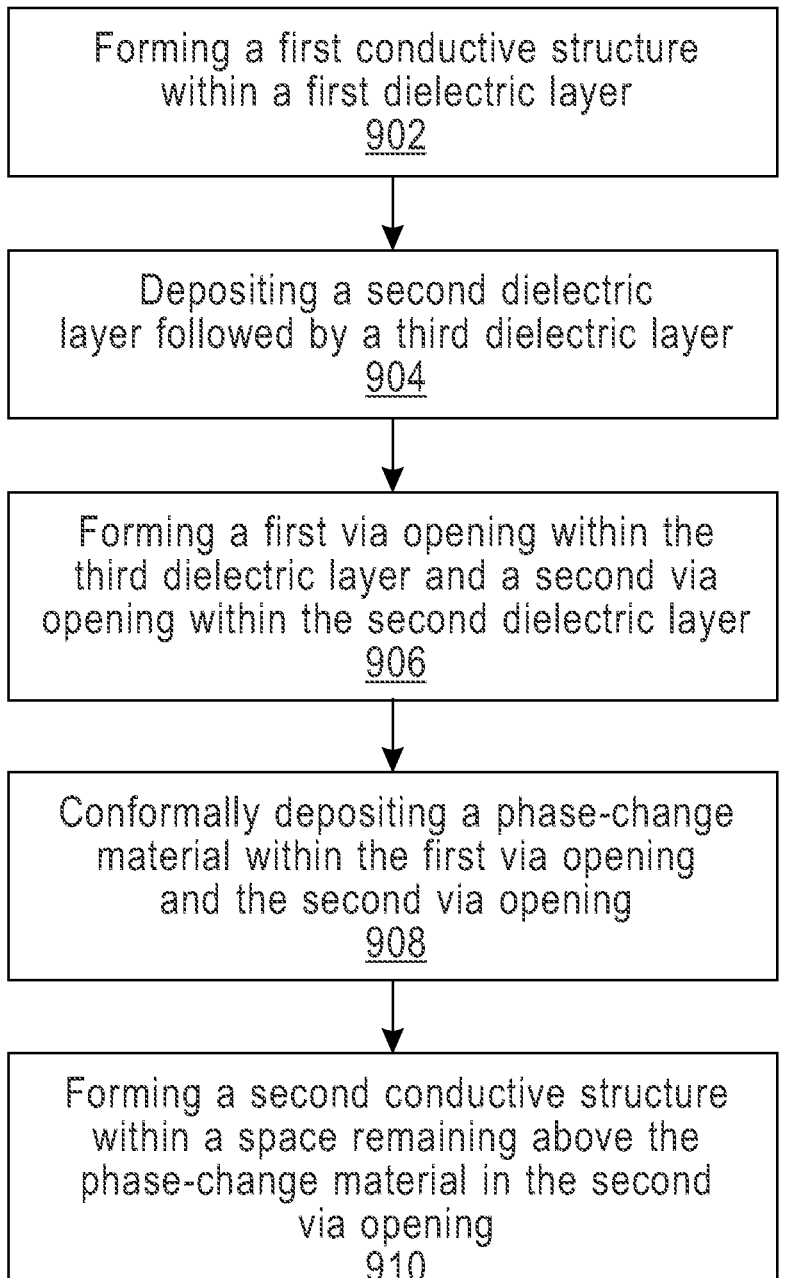

900

Forming a first conductive structure
within a first dielectric layer
902

Depositing a second dielectric
layer followed by a third dielectric layer
904

Forming a first via opening within the
third dielectric layer and a second via
opening within the second dielectric layer
906

Conformally depositing a phase-change
material within the first via opening
and the second via opening
908

Forming a second conductive structure
within a space remaining above the
phase-change material in the second
via opening
910

FIG. 9

CONFINED PHASE-CHANGE MEMORY CELL WITH SELF-ALIGNED ELECTRODE AND REDUCED THERMAL LOSS

BACKGROUND

The present invention generally relates to the field of phase-change memory (PCM) devices, and more particularly to a confined phase-change memory cell with self-aligned top electrode.

Devices based on phase-change materials are being explored to implement and accelerate artificial intelligence ("AI") computing circuits. The computation is based on changing the PCM element gradually from a high resistance state (RESET operation), which is the amorphous phase, to a lower resistant state (SET operation), which is the crystalline phase. The PCM device can be used as an analog resistor, where the value of stored data is represented by a continuously variable resistance, rather than a two state, or digital, value of high or low resistance. A challenge of PCM devices is the high power requirement during the RESET operation, which involves melting the PCM material and quickly quenching it.

SUMMARY

According to an embodiment of the present disclosure, a memory device includes a first conductive structure within a first dielectric layer, a phase-change memory pillar including a first portion of a phase-change material is confined within a second dielectric layer, the phase-change memory pillar is electrically connected to the first conductive structure, and a second conductive structure within a third dielectric layer, the second conductive structure is surrounded by a second portion of the phase-change material that electrically connects the second conductive structure to the phase-change memory pillar.

According to another embodiment of the present disclosure, a method of forming a memory device includes forming a first conductive structure within a first dielectric layer, confining a first portion of a phase-change material within a second dielectric layer deposited above the first dielectric layer, the first portion of the phase-change material is electrically connected to the first conductive structure, and forming a second conductive structure within a third dielectric layer deposited above the second dielectric layer, a second portion of the phase-change material surrounds the second conductive structure and electrically connects the second conductive structure to the first portion of the phase-change material confined within the second dielectric layer.

BRIEF DESCRIPTION OF THE DRAWINGS

The following detailed description, given by way of example and not intended to limit the invention solely thereto, will best be appreciated in conjunction with the accompanying drawings, in which:

FIG. 9 is a flowchart depicting operational steps for the fabrication of the memory device, according to an embodiment of the present disclosure.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figures 1, 2:
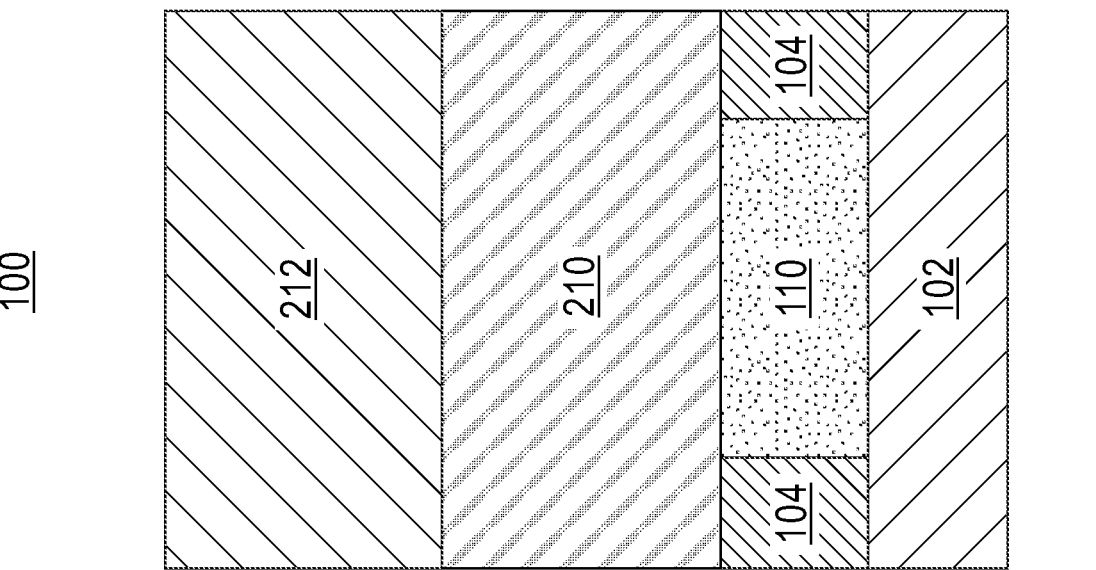
FIG. 1 is a cross-sectional view of a memory device at an intermediate step during a semiconductor manufacturing process, according to an embodiment of the present disclosure.
FIG. 2 is a cross-sectional view of the memory device after forming a second dielectric layer and a third dielectric layer, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Phase-change memory (PCM) has emerged as a viable option for both storage memory and analog computing applications. The operation of PCM devices relies on the phase change of the PCM material to produce a high resistance state (i.e., a RESET operation resulting in an amorphous phase) and a low resistance state (i.e., a SET operation resulting in a crystalline phase). A challenge of PCM devices is the high power requirement during the RESET operation, which involves melting the PCM material and quickly quenching it.

To reduce PCM power consumption, a typical solution includes reducing the volume of the phase-change material. This has worked for confined cell structures in which the PCM material is confined within a small trench. However, challenges exist in the fabrication of confined PCM cells, namely: (1) In conventional confined cells, the top electrode and the confined PCM trench are formed by two separated processes, each requiring different lithography steps. To circumvent the inherent lithographic overlay issue between two lithography steps, the top electrode is typically patterned larger than the diameter of the underlying PCM trench to ensure a full coverage of the top electrode on the confined PCM. The larger electrode disadvantageously behaves as a heat sink which results in greater heat loss; and (2) Using a local heater abutting the PCM improves heating efficiency. However, aligning the local heater to the PCM trench while precisely controlling the dimensions of the heater and the PCM can be very challenging. In addition, heat loss from the heater increases the power consumption of the PCM cell.

Therefore, embodiments of the present disclosure provide a phase-change memory (PCM) device, and a method of making the same, in which (1) the top electrode is self-aligned to the PCM trench, (2) a height of the (confined) PCM cell is defined by a thickness of a deposited dielectric layer (e.g., SiN), and (3) a low thermal conductivity shell composed of the same phase-change material as the PCM cell is formed around the top electrode to further reduce heat loss.

An embodiment by which the PCM device with self-aligned top electrode and reduced heat loss can be formed is described in detailed below by referring to the accompanying drawings in FIGS. 1-9.

Referring now to FIG. 1, a cross-sectional view of a memory device 100 at an intermediate step during a semiconductor manufacturing process is shown, according to an embodiment of the present disclosure. In this embodiment, the memory device 100 includes a first conductive structure or bottom electrode 110 that is embedded in a first dielectric layer 104. The bottom electrode 110 is electrically connected to a device level 102 located below the bottom electrode 110. Although not depicted in the figures, the device level 102 may include a plurality of field effect transistors (FETs) devices having a variety of different configurations, e.g., planar transistor devices, finFET transistor devices, nanowire transistor devices, and the like. The device level 102 may also include contact structures for establishing an electrical connection to the FET devices. In addition to active circuit elements or semiconductor devices, the device level 102 may also include passive circuit elements such as resistors, capacitors, etc.

The first dielectric layer 104 may include a dielectric material such as, for example, a low-k dielectric material having a dielectric constant, k, in the range of approximately 2.4 to approximately 2.7. In some embodiments, the first dielectric layer 104 may include silicon oxide, silicon nitride, hydrogenated silicon carbon oxide, silicon based low-k dielectrics, or porous dielectrics. The first dielectric layer 104 may be formed by any suitable deposition process including, for example, chemical vapor deposition (CVD), physical vapor deposition (PVD), and the like. In one or more embodiments, a thickness of the first dielectric layer 104 may vary from approximately 70 nm to approximately 180 nm, although thicknesses greater than 180 nm and less than 70 nm may also be used.

The bottom electrode 110 surrounded by the first dielectric layer 104 provide an interconnect level for the memory device 100. The first dielectric layer 104 and the bottom electrode 110 can be formed utilizing conventional processes that are well-known to those skilled in the art including, for example, a damascene process. So as not to obscure the method of the present application, the techniques used to form the interconnect level provided by the first dielectric layer 104 and the bottom electrode 110 are not provided herein.

According to an embodiment, the bottom electrode 110 is composed of an electrically conductive metal or metal alloy. Examples of electrically conductive materials that may be used in the present application to form the bottom electrode 110 include tungsten (W), aluminum (Al), copper (Cu), cobalt (Co), nickel (Ni), titanium (Ti), ruthenium (Ru), molybdenum (Mo), or any other suitable conductive material.

In some embodiments, a diffusion barrier liner (not shown) composed of a diffusion barrier material (i.e., a material that serves as a barrier to prevent a conductive material such as copper from diffusing there through) can be formed along a bottom surface and sidewalls of the bottom electrode 110. Examples of diffusion barrier materials that can be used in providing the diffusion barrier liner, if formed, may include, but are not limited to, Ta, TaN, Ti, TiN, Ru, RuN, RuTa, RuTaN, W, or WN. In some embodiments, the diffusion barrier liner may include a stack of diffusion barrier materials. In one example, the diffusion barrier material may be composed of a stack of Ta/TaN. In the depicted embodiment, no diffusion barrier liner is formed.

Alternatively or additionally, in some embodiments, a shell (not shown) composed of layers of a phase-change material can be formed on an uppermost surface and sidewalls of the bottom electrode 110, as will be described in detail below with reference to FIG. 8A.

Referring now to FIG. 2, a cross-sectional view of the memory device 100 is shown after forming a second dielectric layer 210 and a third dielectric layer 212, according to an embodiment of the present disclosure.

The second dielectric layer 210 is formed above the first dielectric layer 104 and the bottom electrode 110, as depicted in the figure. In this embodiment, the second dielectric layer 210 is composed of silicon nitride (SiN) and may be formed using any suitable deposition process including, for example, CVD. A thickness of the second dielectric layer 210 may vary between approximately 70 nm to approximately 150 nm, although thicknesses greater than 150 nm and less than 70 nm may also be used. According to an embodiment, the thickness of the second dielectric layer 210 may determine a height of a subsequently formed PCM cell or active region of the memory device 100.

The third dielectric layer 212 is formed directly above the second dielectric layer 210. In this embodiment, the third dielectric layer 212 is composed of silicon dioxide ($SiO_2$) and may be formed using any suitable deposition process including, for example, CVD. A thickness of the third dielectric layer 212 may vary from approximately 50 nm to approximately 200 nm, although thicknesses greater than 200 nm and less than 50 nm may also be used. According to an embodiment, the third dielectric layer 212 may surround or enclose a subsequently formed top electrode (shown in FIG. 8) acting as an isolation layer.

Figure 3:
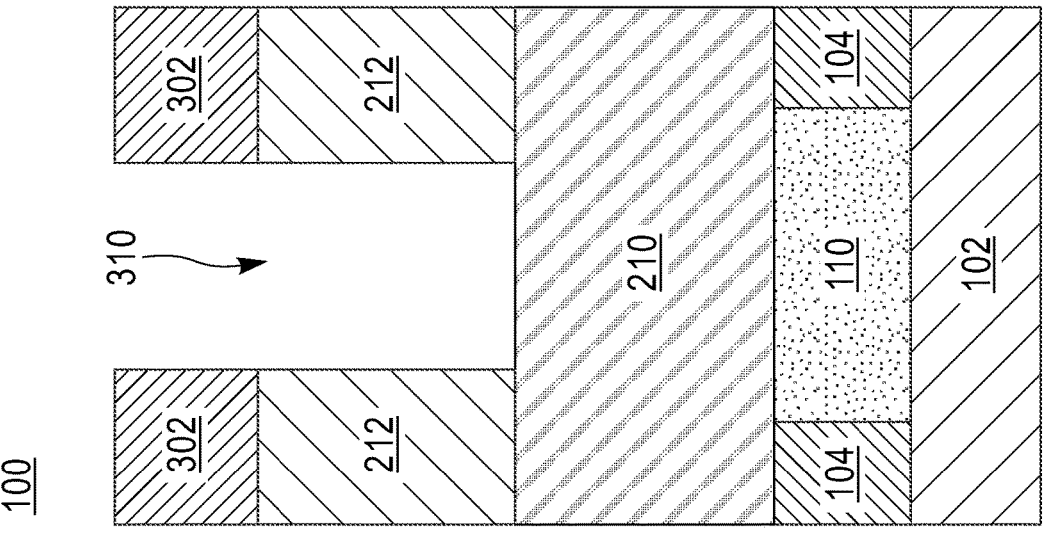
FIG. 3 is a cross-sectional view of the memory device after forming a sacrificial hardmask and patterning the third dielectric layer, according to an embodiment of the present disclosure.

Referring now to FIG. 3, a cross-sectional view of the memory device 100 is shown after forming a sacrificial hardmask 302 and patterning the third dielectric layer 212, according to an embodiment of the present disclosure.

The sacrificial hardmask 302 is formed above, and in direct contact with, the third dielectric layer 212. The process of forming the sacrificial hardmask 302 is typical and well-known in the art and generally includes depositing a hardmask material and conducting a photolithographic patterning on the deposited hardmask material. In the described embodiment, the sacrificial hardmask 302 is composed of titanium nitride (TiN) or similar materials. In other embodiments, the sacrificial hardmask 302 may be a soft mask made of any organic planarizing material that is capable of effectively preventing damage of underlying layers during subsequent etching processes. The term sacrificial, as used herein, means a layer or other structure, that is (or a part thereof is) removed before completion of the final device.

As described above, after depositing the hardmask material forming the sacrificial hardmask 302, a pattern may be exposed on a photoresist layer (not shown) and transferred to the sacrificial hardmask 302 and the third dielectric layer 212 using known patterning techniques including, for example, lithography followed by reactive ion etch (RIE) processing. As depicted in the figure, patterning of the third dielectric layer 212 creates a first via opening 310 that exposes a top surface of the second dielectric layer 210. Stated differently, etching of the third dielectric layer 212 is conducted until exposing an uppermost surface of the second dielectric layer 210.

Figure 4:
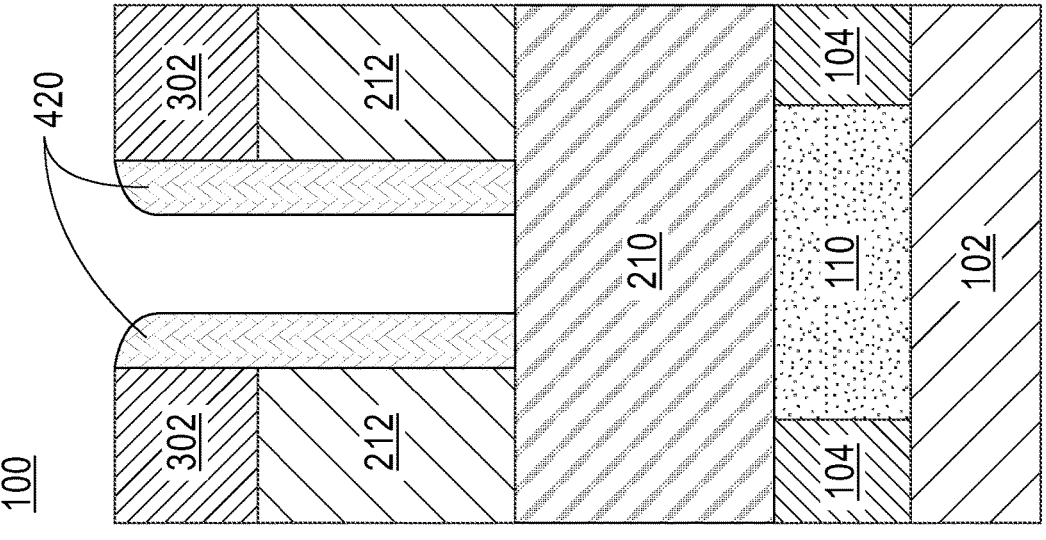
FIG. 4 is a cross-sectional view of the memory device after forming a sacrificial spacer, according to an embodiment of the present disclosure.

Referring now to FIG. 4, a cross-sectional view of the memory device 100 is shown after forming sacrificial spacers 420 within the first via opening 310 (FIG. 3), according to an embodiment of the present disclosure.

In this embodiment, a sacrificial spacer material is conformally deposited on the memory device 100 and then removed from horizontal surfaces (e.g., using directional RIE) to form the sacrificial spacers 420. For example, the sacrificial spacers 420 can be formed by a deposition process such as chemical vapor deposition (CVD) followed by a RIE process. As depicted in the figure, the sacrificial spacers 420 are formed along opposite sidewalls of the sacrificial hardmask 302 and along opposite sidewalls of the third dielectric layer 212. Non-limiting examples of various spacer materials to form the sacrificial spacers 420 may include materials such as $SiO_2$, SiOC, SiOCN, SiBCN, amorphous silicon (a-Si), amorphous silicon germanium (a-SiGe), and the like. In the described embodiment, the sacrificial spacers 420 include a-SiGe, so the sacrificial spacers 420 can be subsequently removed selective to other layers in the memory device 100 (e.g., sacrificial hardmask 302, third dielectric layer 212, second dielectric layer 210, and bottom electrode 110). Typically, a thickness of the sacrificial spacers 420 may vary from approximately 5 nm to approximately 20 nm, and ranges therebetween, although thicknesses greater than 20 nm and less than 5 nm can also be considered.

Figure 5:
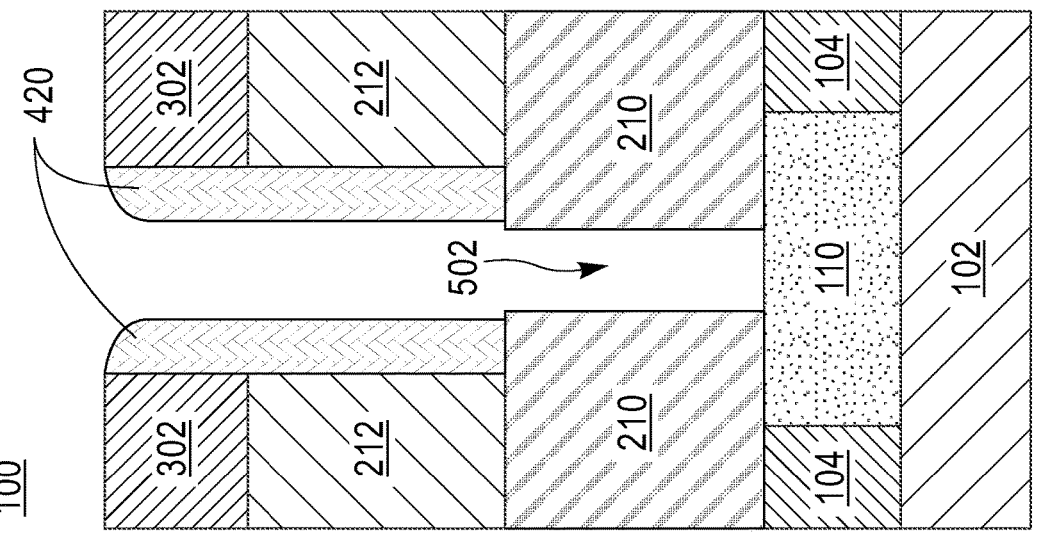
FIG. 5 is a cross-sectional view of the memory device after forming a second via opening in the second dielectric layer, according to an embodiment of the present disclosure.

Referring now to FIG. 5, a cross-sectional view of the memory device 100 is shown after forming a second via opening 502 in the second dielectric layer 210, according to an embodiment of the present disclosure.

In this embodiment, an etching process (e.g., RIE) is conducted to form the second via opening 502 in the second dielectric layer 210. The etching process is conducting until exposing an uppermost surface of the bottom electrode 110, as depicted in the figure.

Figure 6:
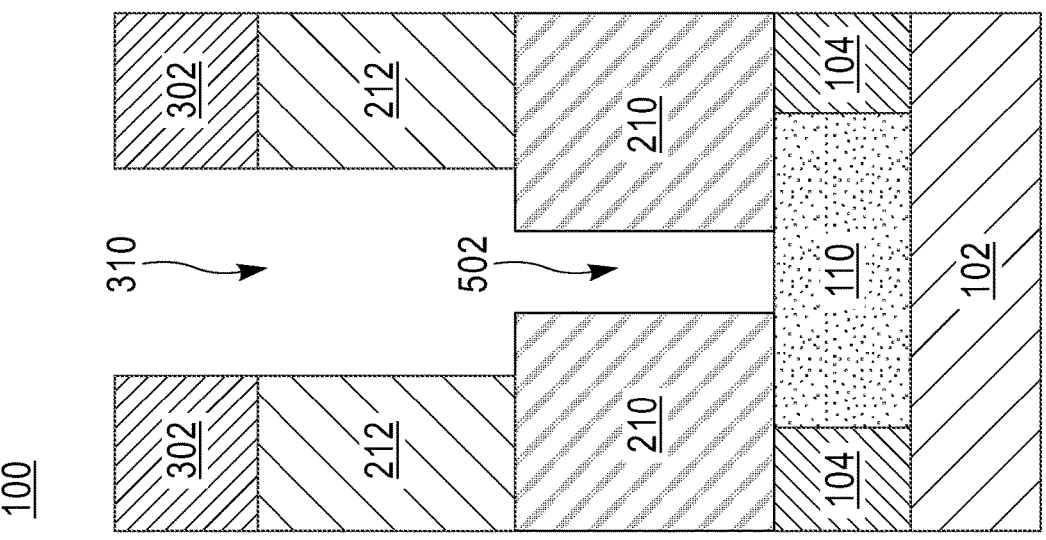
FIG. 6 is a cross-sectional view of the memory device after removing the sacrificial spacer, according to an embodiment of the present disclosure.

Referring now to FIG. 6, a cross-sectional view of the memory device 100 is shown after removing the sacrificial spacers 420 (FIG. 5), according to an embodiment of the present disclosure.

Known etching processes can be conducted on the memory device 100 to remove the sacrificial spacers 420 (FIG. 5). For example, in embodiments in which the sacrificial spacers 420 include a-SiGe, an aqueous solution containing a mix of ammonia and hydrogen peroxide can be used to selectively remove the sacrificial spacers 420 (FIG. 5) from the memory device 100. In some embodiments, the hardmask layer 302 can be removed together with the sacrificial spacers 420.

After removing the sacrificial spacers 420 (FIG. 5), it can be observed that the first via opening 310 located within the third dielectric layer 212 is wider than the second via opening 502 located within the second dielectric layer 210. In this embodiment, the thickness of the sacrificial spacers 420 determines the width difference between the first via opening 310 and the second via opening 502. Thus, the subsequently formed top electrode (FIG. 0.8) substantially covers the PCM trench or second via opening 502 containing the phase-change material (FIG. 7).

Figure 7A:
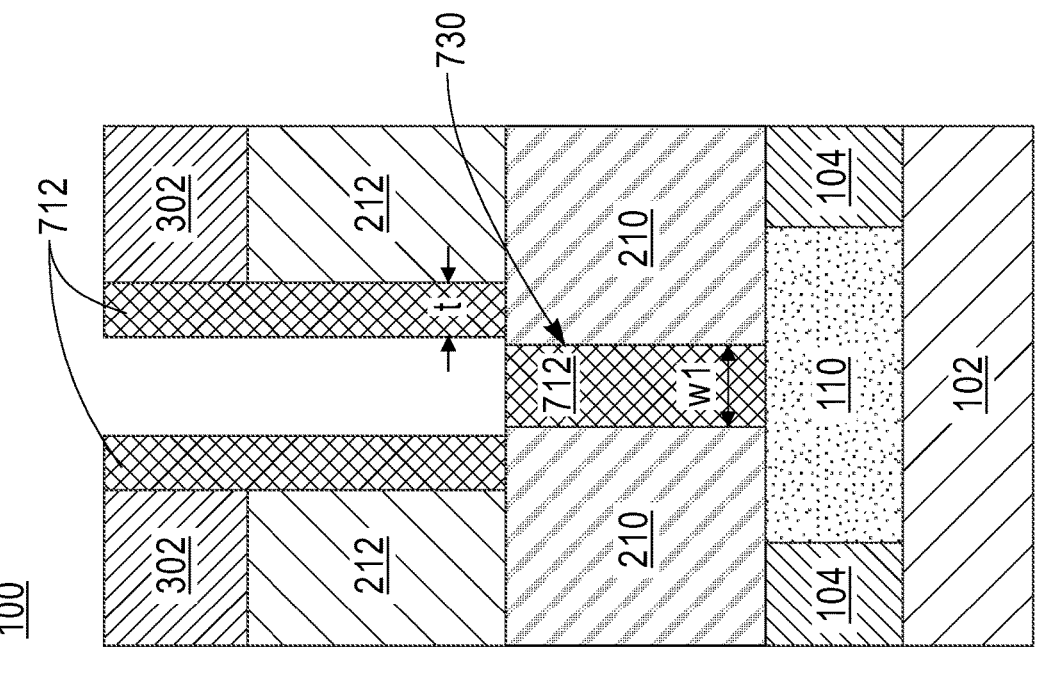
FIG. 7A is a cross-sectional view of the memory device depicting removing horizontal portions of the phase-change material, according to an alternate embodiment of the present disclosure.
Figure 7:
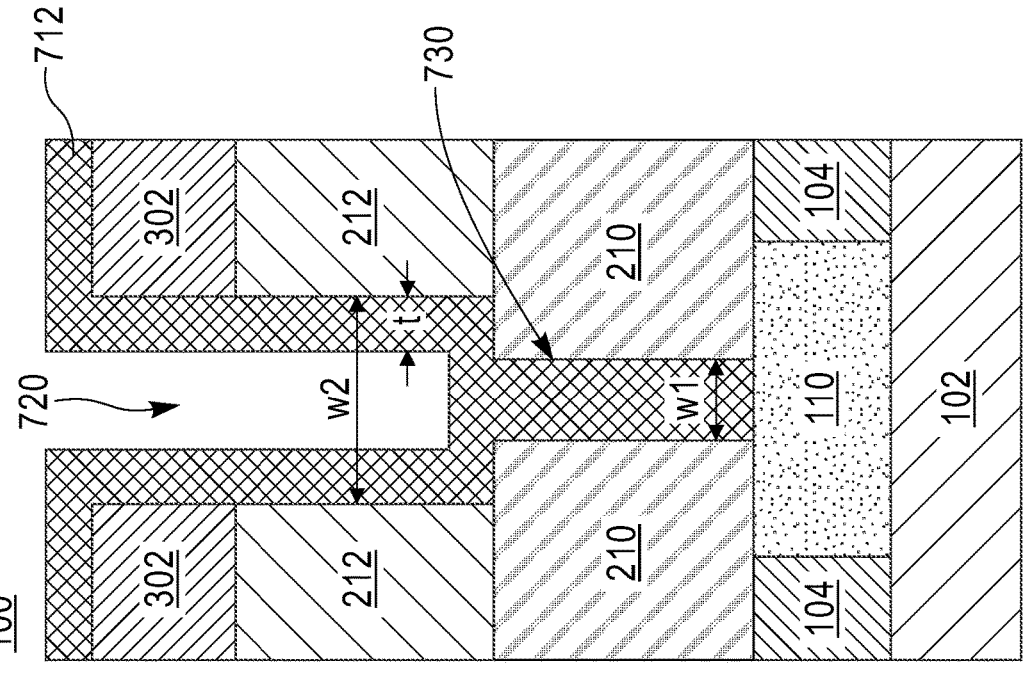
FIG. 7 is a cross-sectional view of the memory device after depositing a phase-change material, according to an embodiment of the present disclosure.

Referring now to FIG. 7, a cross-sectional view of the memory device 100 is shown after depositing a phase-change material 712, according to an embodiment of the present disclosure.

The phase-change material 712 is conformally deposited using, for example, atomic layer deposition (ALD), CVD, and the like. Non-limiting examples of materials for forming the phase-change material 712 may include a Ge—Sb—Te (germanium-antimony-tellurium or "GST") alloy. Alternatively, other suitable materials for the phase-change material 712 include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. In some embodiments, the phase-change material 712 can further include nitrogen, carbon, and/or oxygen. In some embodiments, the phase-change material 712 can be doped with dielectric materials including but not limited to aluminum oxide, silicon oxide, tantalum oxide, hafnium oxide, zirconium oxide, cerium oxide, silicon nitride, silicon oxynitride, germanium oxide, germanium nitride, germanium oxynitride, etc. An example method for forming the phase-change material 712 includes, preferably, a conformal deposition process such as atomic layer deposition (ALD), or chemical vapor deposition (CVD). In some embodiments, a resistive liner (not shown) is deposited before the deposition of the phase-change material 712. The resistive liner materials can be, for example, aluminum nitride (AlN), boron nitride (BN), aluminum oxide (AlO), TaN, TiN, tungsten nitride (WN), cobalt tungsten (CoW), nickel tungsten (NiW), or yttrium oxide (YO), or any combination thereof. The resistance of resistive liner is substantially greater the resistance of the heater (e.g., five to fifty times higher, or about twenty times higher). Furthermore, the resistance of the resistive liner is substantially greater than the resistance of the phase-change material 712 in a low resistance, polycrystalline state (e.g., ten to forty times higher, or about twenty times higher) and substantially lower than the resistance of the phase-change material 712 in high resistance, amorphous state (e.g., five to fifty times lower, or about ten times lower). The resistivity of the resistive liner can be, for example, in the range of 0.1 ohm micrometers ($\Omega$ $\mu$m) to 1 kiloohm micrometers (k$\Omega$ $\mu$m). The resistive liner can be deposited by any suitable technique, including but not limited to ALD, PVD, CVD, etc.

It should be noted that the conformally deposited phase-change material 712 completely pinches off the (narrower) second via opening 502 (i.e., bottom via) shown in FIG. 6, but not the (wider) first via opening 310 (i.e., top via) also shown in FIG. 6. By completing filling the second via opening 502 (FIG. 6), a pillar 730 of phase-change material 712 is formed within the second dielectric layer 210. According to an embodiment, the pillar 730 extends between, and is electrically connected to, the bottom electrode 110 and the subsequently formed bottom electrode 802 (FIG. 8).

More particularly, according to an embodiment, a thickness t of the phase-change material 712 may be less than half a distance $w_2$ between opposite sidewalls of the third dielectric layer 212, and greater than half a distance $w_1$ between opposite sidewalls of the second dielectric layer 210 to achieve the configuration depicted in FIG. 7. In an exemplary embodiment, the thickness t of the of the phase-change material 712 may be approximately 15 nm, the distance $w_1$ between opposite sidewalls of the second dielectric layer 210 may be approximately 20 nm, and the distance $w_2$ between opposite sidewalls of the third dielectric layer 212 may be approximately 50 nm.

Alternatively or additionally, in some embodiments, a RIE process can be conducted after depositing the phase-change material 712 to remove the phase-change material 712 from horizontal surfaces of the memory device 100, as depicted in FIG. 7A. In such embodiments, the phase-change material 712 remains along opposite sidewalls of the third dielectric layer 212 and sacrificial hardmask 302, as illustrated in FIG. 7A.

In one or more embodiments, the pillar 730 of phase-change material 712 is capable of being switched between a first structural state in which the material is in a generally amorphous solid phase, and a second structural state in which the material is in a generally crystalline solid phase in its local order in the active channel region of the cell. Phase change materials are at least bistable. The term amorphous is used to refer to a relatively less ordered structure, more disordered than a crystalline structure, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase.

Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Figures 8, 8A:
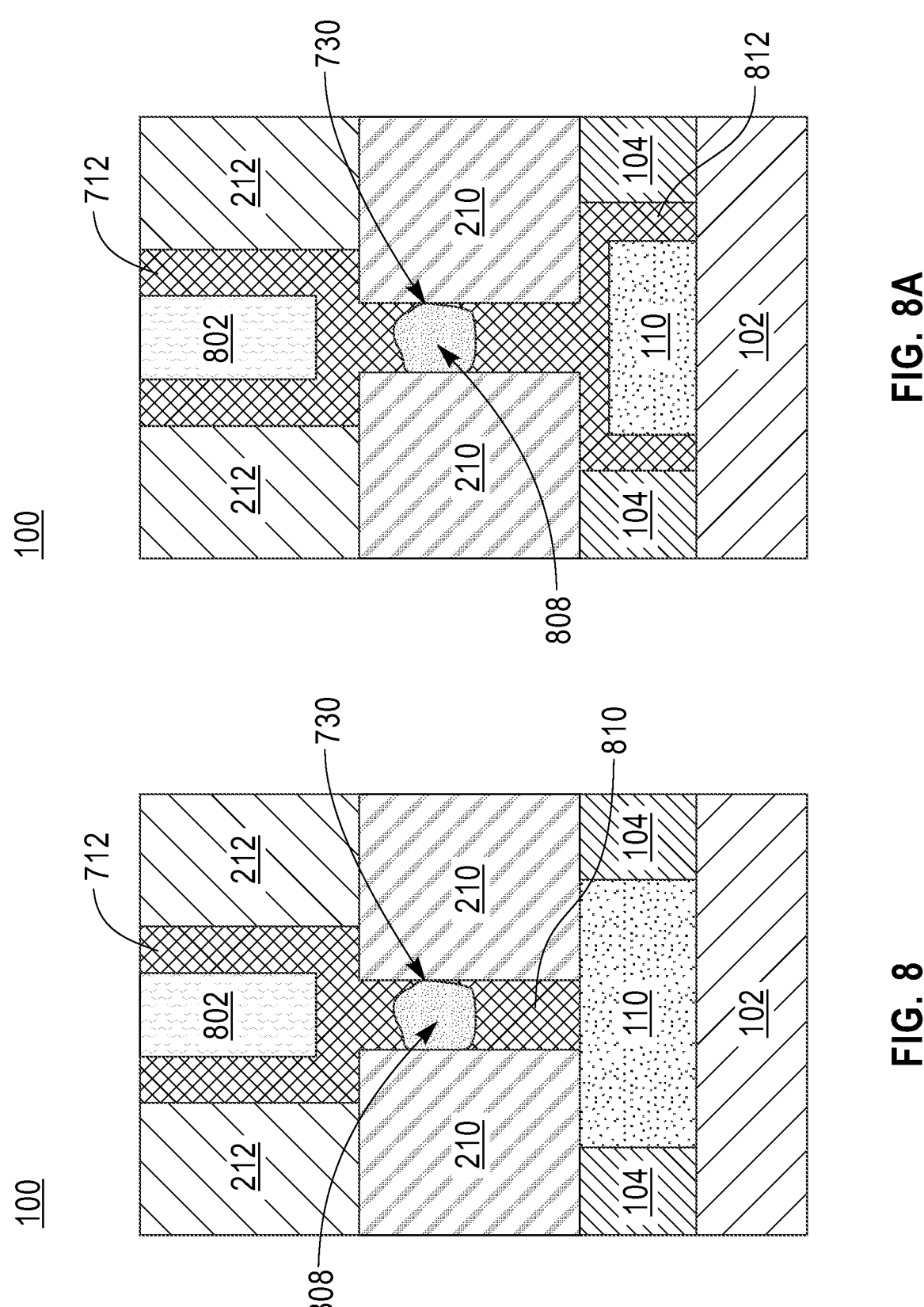
FIG. 8 is a cross-sectional view of the memory device after forming a top electrode, according to an embodiment of the present disclosure.
FIG. 8A is a cross-sectional view of the memory device depicting forming a phase-change material shell around the bottom electrode, according to an alternate embodiment of the present disclosure.

Referring now to FIG. 8, a cross-sectional view of the memory device 100 is shown after forming a top electrode 802, according to an embodiment of the present disclosure.

In this embodiment, a conductive material is deposited in direct contact with the phase-change material 712 substantially filling a remaining space 720 (depicted in FIG. 7) to form a second conductive structure or top electrode 802. The conductive material forming the top electrode 802 may be formed using standard deposition methods such as, for example, CVD. In an embodiment, the top electrode 802 may be composed of a single conductive material (e.g., TiN), multiple materials (e.g., TaN/Ti/TiN), or a conductive material surrounded by a liner (e.g., W surrounded by a TaN liner). As known by those skilled in the art, materials and processes used for forming the bottom electrode 110 can also be used for forming the top electrode 802.

After forming the top electrode 802, a planarization process is conducted on the memory device 100. In one or more embodiment, the sacrificial hardmask 302 can be removed during the planarization process. Thus, top surfaces of the top electrode 802, third dielectric layer 212 and phase change-material 712 are substantially coplanar after the planarization process, as depicted in the figure. In an exemplary embodiment, the planarization process includes a chemical mechanical polishing (CMP) process.

As can be observed in the figure, the top electrode 802 is surrounded by a portion or shell including the phase-change material 712. Since the phase-change material 712 has a lower thermal conductivity than the dielectric materials forming the second dielectric layer 210 (i.e., SiN) and the third dielectric layer 212 (i.e., SiO2), this portion of the phase-change material 712 prevents heat loss from the underlying pillar 730 (i.e., heating element) to the top electrode 802. Thus, the depicted configuration can reduce heat loss in the memory device 100 during programming.

It should also be noted that, in the proposed embodiment, a higher heat or active phase-change region 808 including the (amorphized) phase-change material 712 is located close to the middle region or mid-section of the (narrower) pillar 730. The active phase-change region 808 occurs essentially in the pillar 730 of phase-change material 712 because the top electrode 802 and bottom electrode 110 are typically good thermal conductors (e.g. metal(s)), and can draw heat away from the ends of the pillar 730 during programming. Thus, the hottest portion of the pillar 730 occurs between the thermal sinks created by the top electrode 802 and bottom electrode 110. During a reset operation, a portion or the entire pillar 730 of phase-change material 712 is melted, which requires significant power and develops significant heat in the memory array, especially when several memory cells are being reset.

Accordingly, by forming the shell of phase-change material 712 surrounding the top electrode 802, heat dissipation from the active phase-change region 808 in the pillar 730 of phase-change material 712 can be substantially lowered thereby reducing the required energy to program the memory device 100.

Alternatively or additionally, in some embodiments, a shell 812 including a phase-change material (hereinafter "phase-change material shell 812") can also be formed around the bottom electrode 110, as shown in FIG. 8A, to further reduce heat loss in the memory device 100. The phase-change material shell 812 substantially covers a top surface and opposite sidewalls of the bottom electrode 110, and may be composed of similar materials as the phase-change material 712.

Referring now to FIG. 9, a flowchart 900 sets forth operational steps for the fabrication of the memory device 100 described above with reference to FIGS. 1-8, according to an embodiment of the present disclosure.

At step 902, a first conductive structure (e.g., bottom electrode 110) is formed within a first dielectric layer (e.g., first dielectric layer 104). The first dielectric layer may be disposed above a previously formed device level, such as device level 102 (FIG. 8).

At step 904, a second dielectric layer (e.g., second dielectric layer 210) is deposited above the first dielectric layer and first conductive structure followed by deposition of a third dielectric layer (e.g., third dielectric layer 212). As described above, standard deposition methods can be used to form the second and third dielectric layers.

At step 906, a first via opening is formed within the third dielectric layer and a second via opening is formed within the second dielectric layer. The first via opening can be formed by depositing a hardmask layer above the third dielectric layer and patterning the third dielectric layer until exposing or reaching a top surface of the second dielectric layer. The second via opening can be formed by forming a sacrificial spacer along opposite sidewalls of the hardmask layer and opposite sidewalls of the third dielectric layer, and etching the second dielectric layer until exposing or reaching a top surface of the first conductive structure. Thus, the second via opening extends through the second dielectric layer until a top surface of the first conductive structure. After forming the second via opening the sacrificial spacer can be removed from the memory device 100 using any suitable etching technique. In one or more embodiments, a width of the first via opening, after removing the sacrificial spacer, is larger than a width of the second via opening.

At step 908, a phase-change material is conformally deposited within the first via opening and the second via opening. According to an embodiment, the phase-change material pinches-off the first via opening such that a first portion of the phase-change material is confined within the second via opening forming a PCM pillar within the second dielectric layer. The first portion of the phase-change material is electrically connected to the first conductive structure.

Finally, at step 910, a second conductive structure (e.g., top electrode 802) is formed within the third dielectric layer. According to an embodiment, a second portion of the phase-change material surrounds the second conductive structure and electrically connects the second conductive structure to the first portion of the phase-change material confined within the second dielectric layer.

In one or more embodiments, the second portion of the phase-change material substantially covers a bottom surface and opposite sidewalls of the second conductive structure. In some embodiments, horizontal surface(s) of the phase-change material can be removed from the memory device 100. In such embodiments, the bottom surface of the second conductive structure is not covered by the second portion of the phase-change material (i.e., the portion of the phase-change material that deposits within the first via opening).

In some embodiments, a phase-change material shell composed of the same phase-change material can be formed surrounding the first conductive structure. In such embodiments, the phase-change material shell substantially covers a top surface and opposite sidewalls of the first conductive structure.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which includes one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device, comprising:
a first conductive structure within a first dielectric layer;
a phase-change memory pillar including a first portion of a phase-change material confined within a second dielectric layer, the phase-change memory pillar being electrically connected to the first conductive structure;
a second conductive structure within a third dielectric layer, wherein a second portion of the phase-change material surrounds the second conductive structure and electrically connects the second conductive structure to the phase-change memory pillar; and
a phase-change material shell surrounding the second conductive structure and formed around the first conductive structure to cover a top surface and opposite sidewalls of the first conductive structure, wherein a thickness of the phase-change material is less than half a distance between opposite sidewalls of the third dielectric layer and greater than half a distance between opposite sidewalls of the second dielectric layer.

2. The memory device of claim 1, wherein the first conductive structure comprises a bottom electrode and the second conductive structure comprises a top electrode.

3. The memory device of claim 1, wherein the phase-change material is selected from the group consisting of: Ge—Sb—Te alloys, Si—Sb—Te alloys, Ga—Sb—Te alloys, Ge—Bi—Te alloys, In—Se alloys, As—Sb—Te alloys, Ag—In—Sb—Te alloys, Ge—In—Sb—Te alloys, Ge—Sb alloys, Sb—Te alloys, and Si—Sb alloys.

4. The memory device of claim 1, wherein the second portion of the phase-change material substantially covers a bottom surface and opposite sidewalls of the second conductive structure.

5. The memory device of claim 1, wherein the phase-change material shell surrounds the first conductive structure, the phase-change material shell comprising the phase-change material.

6. The memory device of claim 1, wherein a thermal conductivity of the phase-change material shell is less than a thermal conductivity of the second dielectric layer and less than a thermal conductivity of the third dielectric layer for reducing heat loss.

7. The memory device of claim 1, wherein the second dielectric layer is made of silicon nitride and the third dielectric layer is made of silicon dioxide.

8. The memory device of claim 1, further comprising a device level located below the first conductive structure.

9. The memory device of claim 1, wherein the second dielectric layer is made of silicon nitride and the third dielectric layer is made of silicon dioxide.

10. A memory device, comprising:
a first dielectric layer;
a second dielectric layer deposited above the first dielectric layer;
a third dielectric layer deposited above the second dielectric layer;
a phase change memory comprising a phase-change material that has at least a phase-change material shell above a phase-change memory pillar, wherein a thickness of the phase-change material is less than half a distance between opposite sidewalls of the third dielectric layer and greater than half a distance between opposite sidewalls of the second dielectric layer; and
a top electrode surrounded by the phase-change material shell, wherein respective top surfaces of the phase-change material shell and the top electrode are substantially coplanar.

11. The memory device of claim 10, wherein the top electrode and the phase-change memory pillar are substantially aligned.

12. The memory device of claim 10, wherein the phase-change material shell is in direct contact with at least a bottom surface of the top electrode and respective side surfaces of the top electrode.

13. The memory device of claim 10, further comprising a bottom electrode in direct contact with at least a bottom surface of the phase-change memory pillar.

14. The memory device of claim 13, wherein the bottom electrode is within the first dielectric layer.

15. The memory device of claim 10, wherein the phase-change memory pillar is within the second dielectric layer deposited upon the first dielectric layer.

16. The memory device of claim 10, wherein the phase-change material shell is within the third dielectric layer deposited upon the second dielectric layer.

17. The memory device of claim 10, wherein the phase-change material shell comprises respective vertical portions that are above and extend from a horizontal portion.

18. The memory device of claim 17, wherein the top electrode is in direct contact with associated inner side surfaces of the respective vertical portions and is in direct contact with an associated top surface of the horizontal portion.

19. A memory device, comprising:

a first dielectric layer;

a second dielectric layer deposited above the first dielectric layer;

a third dielectric layer deposited above the second dielectric layer;

a phase-change material comprising a central pillar portion, an upper shell portion associated with a top of the central pillar portion, and a lower shell portion associated with a bottom of the central pillar portion, wherein a thickness of the phase-change material is less than half a distance between opposite sidewalls of the third dielectric layer and greater than half a distance between opposite sidewalls of the second dielectric layer;

a top electrode surrounded by the upper shell portion, wherein respective top surfaces of the upper shell portion and the top electrode are substantially coplanar; and a bottom electrode surrounded by the lower shell portion, wherein respective bottom surfaces of the lower shell portion and the bottom electrode are substantially coplanar.

* * * * *